United States Patent [19]

Kadomura

[11] Patent Number: 5,266,157
[45] Date of Patent: Nov. 30, 1993

[54] DRY ETCHING METHOD

[75] Inventor: Shingo Kadomura, Kanagawa, Japan

[73] Assignee: Sony Corporation, Tokyo, Japan

[21] Appl. No.: 770,338

[22] Filed: Oct. 3, 1991

[30] Foreign Application Priority Data

Oct. 4, 1990 [JP] Japan .................................. 2-265234

[51] Int. Cl.$^5$ ............................................ H01L 21/00
[52] U.S. Cl. ................................ 156/659.1; 156/643; 156/646; 156/668
[58] Field of Search ..................... 156/659.1, 643, 646, 156/668

[56] References Cited

U.S. PATENT DOCUMENTS 4,992,136 2/1991 Tachi et al. ..................... 156/659.1

FOREIGN PATENT DOCUMENTS

| 151408 | 8/1985 | European Pat. Off. . |
| 58-087824 | 5/1983 | Japan . |
| 60-170238 | 9/1985 | Japan . |
| 61-220432 | 9/1986 | Japan . |
| 61-220433 | 9/1986 | Japan . |
| 63-216346 | 9/1988 | Japan . |
| 1-186622 | 7/1989 | Japan . |
| 1-280316 | 10/1989 | Japan . |

*Primary Examiner*—Brain E. Hearn
*Assistant Examiner*—George Goudreau
*Attorney, Agent, or Firm*—Hill, Steadman & Simpson

[57] ABSTRACT

There is provided a method for anisotropic etching of a fine resist pattern at a practically useful etching rate wherein micro-loading effects are suppressed. If a resist layer is etched using an $NH_3/N_2$ gas mixture, while the temperature of a sample wafer is controlled to be not higher than 50° C., a reaction product containing at least N, C and O is produced. The micro-loading effects are suppressed because deposition and sputtering of the reaction product occur competitively on the wafer surface. Since etching of the ion mode is accelerated by $N_2$, the etching rate as well as anisotropy is improved. There ia also provided a method of supplying sulfur to a $NH_3$-containing etching reaction system and utilizing the yielded ammonium sulfide for sidewall protection for further improving anisotropy. In more detail, sulfur is introduced by ion implantation into an area to be etched, at least the surface of a member of an apparatus provided in the vicinity of the sample wafer is formed of a sulfur-based material, or a sulfur compound such as $H_2S$ is added to an etching gas. Sulfur is supplied into the reaction system by sputtering with the first two methods, and by decomposition of the sulfur compound in the gaseous phase with the latter method.

12 Claims, 1 Drawing Sheet

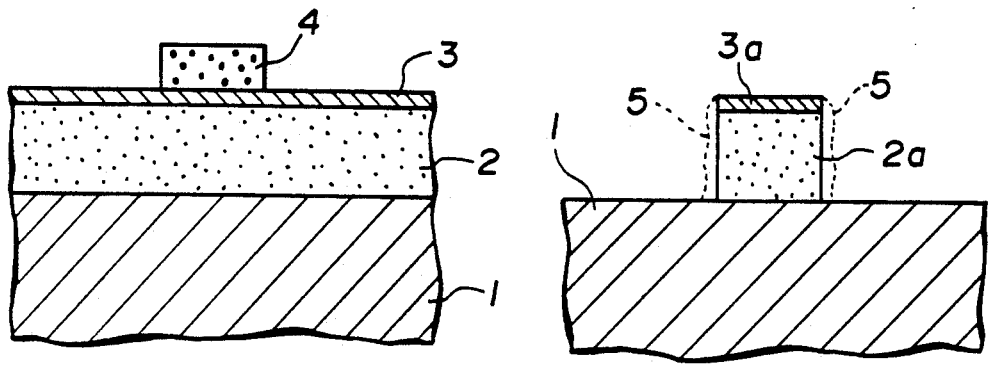
FIG.1(A)  FIG.1(B)
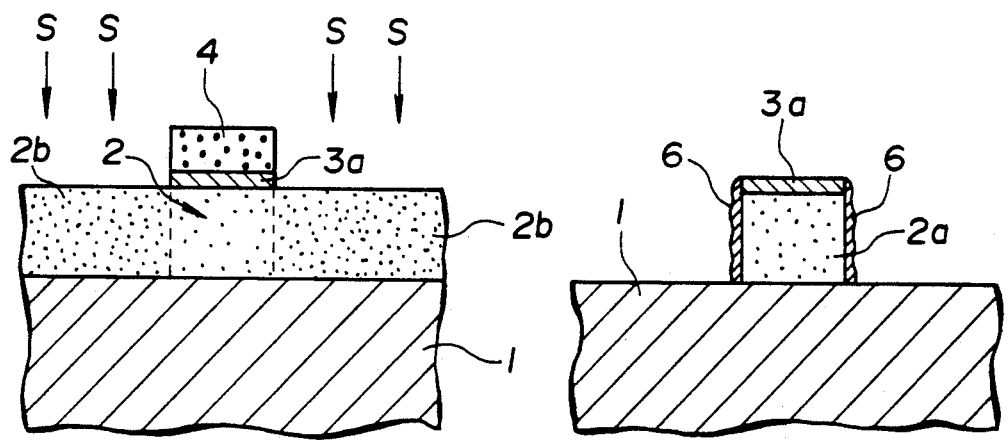
FIG.2(A)  FIG.2(B)
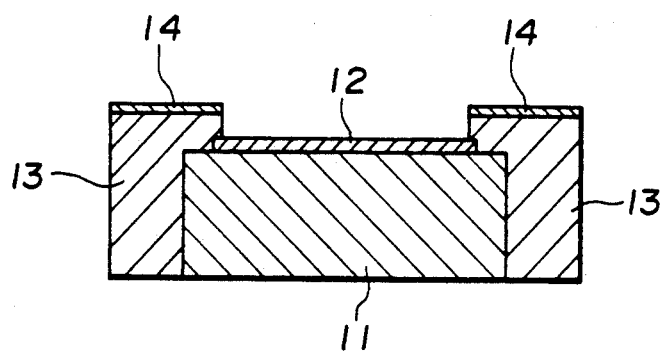
FIG.3

DRY ETCHING METHOD

BACKGROUND OF THE INVENTION

Field of the Invention

This invention relates to a dry etching method. More particularly, it relates to a dry etching method with which it is possible, in forming a fine resist pattern, to suppress micro-loading effects, achieve a practically useful etching rate and improve anisotropy.

Recently, with refining of a design rule of semiconductor devices, a demand for higher resolution and shape anisotropy is increasing acutely. As a technique of producing such a resist pattern, there is known a multi-layer resist process in which at least two resist layers, namely an upper resist layer adapted to be uniformly exposed to light across its thickness to assure high resolution, and a lower resist layer having superior properties in covering step differences on a base layer, are used in combination. Recently, an exposure device known as an eximer laser stepper capable of coping with a 0.35 μm rule has been developed and a multi-layer process is becoming an indispensable technique in the field of photolithography employing such light exposure device.

However, it is difficult to carry out the multi-layer resist process at a higher rate and with good controllability mainly because an oxygen gas is used in general for etching the multi-layer resist process. The oxygen gas tends to produce oxygen radicals O* in a gaseous phase which are responsible for lowered anisotropy and manifestation of the micro-loading effects. For coping with these inconveniences, extreme physical conditions, such as high bias voltages or low gas pressures, may be used to increase an energy of an incident ion energy or to elongate the mean free path of etchants. However, these measures tend to lower the etching rate drastically or to increase etching damages.

Various investigations into the technique of possibly overcoming these inconveniences are proceeding briskly. The present assignee has also proposed (a) a technique of using $N_2$ as an etching gas, (b) a technique of using $NH_3$ as an etching gas and (c) a technique of using an etching gas containing both $O_2$ and Cl-based gas.

Of these, the technique (a) has been proposed by the present assignee in the JP Patent Publication KOKAI No. 1-215024 (1989). It is possible with this technique to perform anisotropic etching under a lower bias voltage than that used in case of using $O_2$.

The technique (b) of using $NH_3$ as an etching gas has been proposed by the present assignee in our copending JP Patent Publication KOKAI NO. 1-280316 (1989). It is possible with this technique to realize a higher etching rate than that when using $N_2$. A technique of controlling the temperature of the etched substrate to not higher than 50° C. to allow a reaction product to be deposited partially to lower the micro-loading effects has also been reported by a group of researchers, of which the present inventors are members, in Extended Abstracts in the 51st Autumn Meeting, 1990, in the Japan Society of Applied Physics, second volume, page 459, title number 26a-ZF-2.

The technique (c) of using an etching gas containing both $O_2$ and Cl-bases gas has been reported by a group of researchers, of which the present inventors are members, in Extended Abstracts of the 22nd Conference on Solid-State Devices and Materials, pages 203 to 206 (1990). With this technique, a sidewall protection film is utilized to achieve anisotropic etching.

It is also contemplated to effect etching by cooling the base plate to be etched to a temperature not higher than 0° C. This is a so-called low temperature etching which is recently attracting attention in the field of dry etching. With the low temperature etching, as reported on pages 42 to 49 of Extracts of Dry Process Etching Symposium of 1988, the base plate to be etched is maintained at a lower temperature to halt a radical reaction on the sidewall to prevent shape defects, such as side etching, as the etching rate along the depth is maintained by an ion assist effect. As an example of application to resist etching, there is reported in Extended Abstracts, in the 36th Spring Meeting of the Japan Society of Applied Physics and Related Societies, page 574, lecture number 1p-L-15, an example of etching a lower resist layer of a three-layered resist pattern, with the use of an $O_2$ gas, as the wafer is cooled to a temperature not higher than $-100°$ C.

However, the above depicted conventional measures suffer from several drawbacks. First, with the use of $NH_3$ as an etching gas, anisotropic etching under a lower bias voltage may be achieved more promptly than with the use of $N_2$ gas, however, with an electron cyclotron resonance (ECR) system or a magnetron system of the high density plasma generating type, the operation of hydrogen radicals H* yielded upon dissociation of $NH_3$ becomes manifest to produce undercuts. With the use of the etching gas containing $O_2$ and Cl-based gas, amorphous silicon etc. is etched by the operation of the Cl-based gas, so that the material of the intermediate layer in the three-layer resist process is necessarily limited to the silicon oxide type material. In case of the low temperature etching, the temperature need to be lower than $-100°$ C. to allow for deposition of a reaction product contributing to anisotropy. Hence, existing systems cannot be used for low temperature etching in consideration of the necessity for providing a cooling system or measures against dewing. In addition, the throughput of the system may be lowered in consideration of the time necessary for cooling or raising the temperature to room temperature.

OBJECT AND SUMMARY OF THE INVENTION

It is a principal object of the present invention to provide a method for dry etching whereby the micro-loading effects may be suppressed and a practically useful etching rate is achieved, while a satisfactory anisotropic etching may be achieved even under high plasma density and low bias voltage, without giving rise to the above disadvantages.

For accomplishing the above object, the present invention provides a dry etching method comprising etching a layer of a resist material formed on a base plate to be etched, using an etching gas containing $NH_3$ and $N_2$, whilst the temperature of said substrate to be etched is controlled to be not higher than 50° C.

Although a precise mechanism of etching of the layer of the resist material by $NH_3$ is not wholly clear, it has been clarified by the present inventors in our copending JP Patent Publication KOKAI No. 1-280316 that high anisotropy may be attained under a lower bias voltage than when using $O_2$ and, due to the operation of H in $NH_3$, etching may proceed at a much higher rate than when using $N_2$. As has also been clarified by a group of researchers, of which the present inventors are members, if the temperature of the etched base plate is controlled to be 50° C. or lower in the etching making use of $NH_3$, deposition of a part of a reaction product and sputtering out of the reaction product proceed competitively to a more or less extent depending on the size of the etched area, so that the micro-loading effect may be suppressed.

Although the precise composition of the above mentioned reaction product is not wholly clear, it may be premeditated that, from the results of analyses by the present inventors, the reaction product has been produced by reaction of the decomposition products of $NH_3$ with fragments of a resist mask containing C—O or C=O bonds.

In accordance with the present invention, $N_2$ is added to $NH_3$ and, in addition, the temperature of the base plate to be etched is controlled to be 50° C. or lower during etching. As is evident from the fact that a method for etching a layer of a resist material with $N_2$ alone has been proposed in the art, this gas allows an etching solely by contribution of ions without causing a radical reaction, so that the gas, when added to $NH_3$, in no way detracts from anisotropy. On the contrary, the present invention provides for not only suppression of the micro-loading effects and improved anisotropy but also an increased etching rate due to sputtering out by $N_2$ of the aforementioned reaction product.

The present invention also provides a dry etching method wherein sulfur is supplied into an $NH_3$-containing etching reaction system and ammonium sulfide thus produced is utilized for sidewall protection to enable anisotropic etching even under conditions of high plasma density and low bias voltage. Sulfur is supplied by a method of introducing sulfur into an etched region by ion implantation, and/or a method of arranging an internal member, at least the surface of which is formed of a sulfur-containing material in the vicinity of the etched base plate, and/or a method of adding a sulfur compound to the etching gas.

If the former two methods are used, sulfur emitted from the internal member or from the etched area is combined with $NH_3$ in the gaseous phase and deposited as ammonium sulfide on a pattern side wall. Thus, even in an etching system in which a high density plasma is produced by the ECR or magnetron system, the deposited ammonium sulfide acts as a film protecting the sidewall from attack by H* to provide for anisotropic etching even under a lower bias voltage.

If the latter method is used, sulfur emitted on dissociation of the sulfur compound in the plasma is reacted with $NH_3$ to produce ammonium sulfide to display the sidewall protective effects.

In sum, the present invention is highly useful in that etching may be performed at a high plasma density and at room temperature or at a higher temperature, even below 0° C., so that existing devices may be used as a general rule and amorphous silicon may be used as an intermediate film in the three-layer resist process.

Thus the present invention is highly useful for production of semiconductor devices on the basis of highly refined design rule.

BRIEF DESCRIPTION OF THE DRAWINGS

FIGS. 1A and 1B are schematic cross-sectional views showing an embodiment of the etching method of the present invention as applied to a three-layer resist process, step by step, wherein FIG. 1A shows a patterning step for an upper resist layer and FIG. 1B shows an etching step for a lower resist layer.

FIGS. 2A and 2B are schematic cross-sectional views showing a modified embodiment of the etching method of the present invention as applied to a three-layer resist process, step by step, wherein FIG. 2A shows a patterning step for the upper resist layer and the intermediate film and a sulfur ion implantation step and FIG. 2B shows an etching step for the lower resist layer.

FIG. 3 is a schematic cross-sectional view showing the state in which a wafer and a wafer mounting electrode are held by a wafer clamp, on the surface of which a nitrogen sulfide polymer layer is formed, according to a third aspect of the present invention.

DETAILED DESCRIPTION OF THE INVENTION

By referring to the drawings, certain preferred embodiments of the present invention will be explained in detail.

EXAMPLE 1

In the present Example, the invention is applied to a three-layer resist process, and a lower resist layer is etched using an $NH_3/N_2$ gas mixture.

First, referring to FIG. 1A, a novolak-based positive type photoresist, manufactured and sold under the trade name of OFPR 800 by TOKYO OKA KOGYO Co. Ltd. was coated on a silicon base plate 1 to a thickness of ca. 1 μm to form a lower resist layer 2. An intermediate layer 3 of silicon oxide was then formed to a thickness of 0.1 μm by spin-on-glass (SOG) coating or sputtering. A novolak-based positive type photoresist, manufactured and sold under the trade name of TSMR-V3 by TOKYO OKA KOGYO Co. Lyd. to a thickness of ca. 0.5 μm, followed by photolithography by exposure to g-rays (436 nm), for forming a photoresist pattern to a predetermined contour.

The intermediate layer 3 was then etched by reactive ion etching (RIE) with the photoresist pattern 4 as a mask to form an intermediate pattern 3a.

The base plate thus processed was set in a RF bias impressing type microwave plasma etching device equipped with a temperature controlling device adapted for controlling the temperature of the etched base plate or wafer to a temperature not higher than 50° C. The lower resist layer 2 was then etched, while the temperature of the base plate was controlled to be 50° C. under the conditions of the $NH_3$ flow rate of 40 SCCM, the $N_2$ flow rate of 10 SCCM, a gas pressure of 1.3 Pa approximately equal to 10 mTorr, a microwave power of 850 W and an RF bias power of 100 W (2 MHz). During this process, the upper resist pattern 4 and the intermediate pattern 3a acted as masks. Since the upper resist pattern 4 was sputtered and consumed, the lower resist pattern 2a was ultimately formed below the intermediate pattern 3a, as shown in FIG. 1B.

During this etching process, etching proceeded at a practically useful rate with satisfactory shape anisotropy, for reasons that compounds producing numerous radicals were not contained in the etching gas, the gas pressure was lower, reaction products having a sufficiently low vapor pressure were deposited at 50° C. on the sidewall of the pattern to form a sidewall protective film 5, and that ions such as $NH^+$, $N^{+2}$, $H^+$ etc. take part in the etching reaction. In addition, since $N_2$ was added in the etching gas, numerous $N^+$ ions were produced, and the sidewall protective film 5 was sputtered out by these N+ ions competitively with deposition of the sidewall protective film 5. This leads to effective suppression of the micro-loading effects and to expedited etching as compared to the case in which $NH_3$ is used alone as the etching gas. In addition a high frequency bias power about one-half the value when $NH_3$ is used alone as the etching gas suffices. With the bias power thus lowered, etching damages may also be lowered.

It is to be noted that the present invention is not limited to the above described Example. For example, the amount of addition of $N_2$ to $NH_3$ may be changed within a range of 10 to 50%. The etching gas may be admixed with $O_2$ for controlling the etching rate, or with rare gases, such as Ar or He, in expectation of sputtering, diluting, cooling or other useful effects.

EXAMPLE 2

The present Example is another example in which the invention is similarly applied to a three-layer resist process. However, the wafer temperature was lowered as compared to the temperature used in Example 1, by way of performing a so-called low temperature etching.

In the present Example, after patterning the intermediate layer of the base plate shown in FIG. 1A, the base plate was set in a RF bias impressing type microwave plasma etching device operating in a magnetic field, and etching was performed under conditions of the $NF_3$ flow rate of 25 SCCM, $N_2$ flow rate of 25 SCCM, the gas pressure of 1.3 Pa, approximately equal to 10 mTorr, a microwave power of 850 W and an RE bias power of 100 W (2 MHz), whilst the base plate temperature was controlled to $-20°$ C. If $NH_3$ is used alone as the etching gas, a tapered cross-sectional shape results at this order of the lower temperature due to excess deposition of the reaction products. In the present Example, the reaction products are simultaneously sputtered out due to addition of $N_2$ in the etching gas, resulting in satisfactory shape anisotropy. On the other hand, this order of the low temperature may be realized by a simplified cooling equipment, such as a chiller, making use of an organic solvent as a cooling medium, whilst cooling may be achieved without necessitating prolonged time, so that economic advantages or throughput is not lowered appreciably.

EXAMPLE 3

In the present Example, the invention is applied to a three-layer resist process, and a lower resist layer, into which sulfur ions are previously introduced by ion implantation, was etched by $NH_3$. The present Example is explained by referring to FIGS. 2A and 2B, in which parts used in common with FIGS. 1A and 1B are depicted by the same reference numerals.

The steps of forming a multiresist layer, forming a resist pattern by photolithography and of etching the intermediate layer 3 were carried out in the same way as in Example 1 to produce a base plate shown in FIG. 2A. Sulfur was introduced by ion implantation into the overall surface of the base plate at an injection energy of, for example, 150 eV, for selectively forming a high sulfur concentration region 2b with a dosage of $1 \times 10^{16}$ $cm^{-2}$ on that region of the lower resist layer 2 which was not masked by the upper resist pattern 4 and by the pattern of the intermediate layer 3a.

The base plate thus processed was set in a RF bias impressing type ECR plasma etching device and etched under the conditions of a $NH_3$ flow rate of 50 SCCM, a gas pressure of 1.3 Pa, approximately equal to 10 mTorr, a microwave power of 850 W and a RF bias power of 100 W (2 MHz). During this etching process, sulfur emitted by sputtering effects from the high sulfur concentration region with progress of etching was reacted with $NH_3$ in the gaseous phase to produce ammonium sulfide which then was deposited on the sidewall of the pattern to produce a sidewall protective film 6.

In a high density plasma generating type etching device operating in a magnetic field, anisotropic etching is usually difficult to achieve by an etching gas containing only $NH_3$. According to the present invention, satisfactory anisotropic etching may be achieved by supplying sulfur to the etching reaction system to enable the formation of the sidewall protective film 6.

Meanwhile, $N_2$, $O_2$ or rare gases may be added, if so desired, to the etching gas.

EXAMPLE 4

In the present Example, the invention is applied to a three-layer resist process in which a film of sulfur nitride polymer $(SN)_x$ was formed on the surface of a wafer clamp of a RF bias impressing type microwave plasma etching device operating in a magnetic field and at least the base plate to be etched was held during etching.

In the present Example, a wafer mounting electrode 11 and a wafer 12 mounted thereon were held by an alumina wafer clamp 13, as shown in FIG. 3, and the sulfur nitride layer 14 was formed on the upper surface of the wafer clamp 13 by, for example, plasma CVD. Since the sulfur nitride layer 14 was consumed during etching, the thickness of the layer 14 was suitably set as a function of the number of etched base plates if a large number of the base plates were to be etched.

After patterning the intermediate layer of the base plate shown in FIG. 1A, the base plate was secured, along with the wafer mounting electrode 11, by the wafer clamp 13, and was etched under the conditions of the $NF_3$ flow rate of 50 SCCM, a gas pressure of 1.3 Pa approximately equal to 10 mTorr, a microwave power of 850 W and a RF bias power of 100 W (2 MHz). During this etching process, sulfur emitted as etching proceeds from the sulfur nitride polymer layer 14 by sputtering effects was reacted with $NH_3$ in the gaseous phase to yield ammonium sulfide which then was deposited on the sidewall of the pattern to form the sidewall protective layer 6. As a result, the effects similar to those achieved with Example 3 were achieved.

Although the Example has been explained in which the upper surface of the wafer clamp is constructed of a sulfur-containing material, a cathode cover, a wafer cover or a susceptor may be constructed in a similar manner. In sum, any internal member may be constructed in the above described manner provided that it has a surface directed to permit sputtering and arranged in proximity to the etched base plate.

Alternatively, these internal members may be formed of a variety of inorganic materials, such as a ceramic material of alumina or silicon nitride, having sulfur powders sintered on its surface, ceramic starting powders admixed with sulfur powders and molded by powder sintering, or an inorganic material having a sulfur plate affixed to its surface.

EXAMPLE 5

In the present Example, the invention is applied to a three-layer resist process of patterning a layer of an aluminum based material, in which H₂S is used as a sulfur-containing gas. Although explanation with reference to the drawing is not made herein, the silicon base plate 1 in FIG. 1B may be thought of as being the layer of the aluminum-based material.

On this layer of the aluminum-based material layer, an intermediate layer consisting of a lower resist layer and a silicon oxide was formed, in the same way as in Example 1. After applying a resist material thereon, an upper photoresist pattern was formed by predetermined patterning. Finally, the intermediate layer was patterned by RIE.

The base plate thus processed was placed in a RF bias impression type microwave plasma etching device operating in a magnetic field, and etched under conditions of a NH₃ flow rate of 40 SCCM, H₂ flow rate of 10 SCCM, a gas pressure of 6.7 Pa approximately equal to 5 mTorr, a microwave power of 850 W and RF bias power of 50 W (2 MHz). In this manner, a lower resist pattern having shape anisotropy below the pattern of the intermediate layer was ultimately produced.

During this etching process, the lower resist layer was selectively removed by a mechanism in which H yielded by dissociation of H₂ in plasma cooperates with H yielded by dissociation of NH₃ for severing a molecular chain of the lower resist layer, which in turn is sputtered out, so that etching may be expedited as compared to the case in which NH₃ is used alone as an etching gas. Also, when NH₃ is used alone, it is difficult with the above mentioned high density plasma generating type etching system to achieve anisotropic etching, such that undercuts are usually produced in the lower resist pattern. According to the present invention, sulfur produced by dissociation of H₂S is reacted with NH₃ to produce ammonium sulfide which is deposited on the sidewall of the pattern to form a sidewall protective film, so that anisotropic etching may be realized, whilst a bias may be lowered.

The present invention is not limited to the above described Example. Thus, for example, the amount of addition of H₂S to NH₃ may be changed within a range of ca. 10 to 50%. Carbon sulfide etc. may be used as a sulfur-containing gas. N₂, O₂ or rare gases may also be added to the etching gas if so desired.

EXAMPLE 6

In the present Example, the invention is applied to a three-layer resist process of patterning a gate electrode formed of polycrystal silicon, in which H₂S is used as a sulfur-containing gas. Although explanation with reference to the drawing is not made herein, the silicon base plate 1 in FIG. 1A and FIG. 1B may be thought of as being the polycrystal silicon layer.

The process of the present Example is similar to Example 5 except that the intermediate layer is not formed as the silicon oxide layer, but is formed as an amorphous silicon layer deposited to a thickness of ca. 1000 Å by, for example CVD. In the present Example, the lower resist layer could be formed with extremely satisfactory shape anisotropy.

According to the present invention, since Cl-based gas is not contained in the etching gas, amorphous silicon may be used as an intermediate layer, as described hereinabove. When etching the gate electrode using the thus formed intermediate resist pattern as a mask, the pattern of the intermediate pattern may be removed simultaneously by the etching gas, so that the step of eliminating the pattern of the intermediate layer may advantageously be dispensed with.

What is claimed is:

1. A dry etching method comprising the steps of providing a substrate having a layer of resist material formed thereon, etching the layer of resist material in a plasma by providing sulfur and by using an etching gas consisting of NH₃ and N₂ and controlling the temperature of the substrate to be etched to be not higher than 50° C.

2. A dry etching method according to claim 1, wherein the step of providing sulfur is by ion implanting sulfur into an area of the layer of resist material prior to etching.

3. A dry etching method according to claim 1, wherein the step of providing sulfur is by arranging, prior to etching, an internal member having at least a surface being formed of a sulfur-containing material in the vicinity of the substrate to be etched.

4. A dry etching method according to claim 1, wherein the step of providing sulfur provides a sulfur gas in the etching gas.

5. A dry etching method according to claim 4, wherein the sulfur gas is at least one of H₂S and carbon sulfide.

6. A dry etching method comprising the steps of providing a substrate having a layer of resist material to be etched, etching the layer of resist material in a plasma utilizing a gas containing NH₃ and a sulfur compound selected from the group consisting of carbon sulfide and H₂S and controlling the temperature of the substrate to be $\leq 50°$ C.

7. A dry etching method according to claim 3, wherein said sulfur-containing material is one of materials selected from the group consisting of a sulfur nitride polymer layer, a ceramic material having sulfur sintered to its surface, a material produced on sintering a mixture of ceramic powders and sulfur powders and a material obtained by bonding sulfur plates.

8. A dry etching method according to claim 3, wherein said internal member is at least one selected from a group of members consisting of a wafer clamp, a cathode cover, a wafer cover and a susceptor.

9. A dry etching method comprising the steps of providing a substrate with a layer of resist material to be etched, ion implanting sulfur into an area of the layer of resist material and then etching the resist material containing the sulfur in a plasma using an etching gas containing NH₃.

10. A dry etching method comprising the steps of providing a substrate having a layer of resist material to be etched, arranging an internal member having at least a surface being formed of a sulfur-containing material in the vicinity of the substrate to be etched, and then etching the layer of resist material in a plasma using an etching gas containing NH₃.

11. The dry etching method as claimed in claim 10 characterized in that said sulfur-containing material is one of materials selected from the group consisting of a sulfur nitride polymer layer, a ceramic material having sulfur sintered to its surface. a material produced on sintering a mixture of ceramic powders and sulfur powders and a material obtained by bonding sulfur plates.

12. The dry etching method according to claim 10 characterized in that said internal member is at least one of members selected from the group consisting of a wafer clamp, a cathode cover, a wafer cover and a susceptor.

* * * * *